(12) United States Patent
Chang

(10) Patent No.: US 11,342,335 B2
(45) Date of Patent: May 24, 2022

(54) SEMICONDUCTOR STRUCTURE HAVING A GATE STRUCTURE PORTION IN A WORD LINE

(71) Applicant: NANYA TECHNOLOGY CORPORATION, New Taipei (TW)

(72) Inventor: Szu-Yao Chang, New Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 332 days.

(21) Appl. No.: 16/673,975

(22) Filed: Nov. 5, 2019

(65) Prior Publication Data

US 2021/0134805 A1    May 6, 2021

(51) Int. Cl.
| | | |
|---|---|---|
| *H01L 27/108* | (2006.01) | |
| *G11C 8/14* | (2006.01) | |
| *G11C 11/402* | (2006.01) | |
| *H01L 49/02* | (2006.01) | |

(52) U.S. Cl.
CPC .......... *H01L 27/10829* (2013.01); *G11C 8/14* (2013.01); *G11C 11/4023* (2013.01); *H01L 27/10861* (2013.01); *H01L 28/40* (2013.01)

(58) Field of Classification Search
CPC .......... H01L 27/10811; H01L 27/1082; H01L 27/10829; H01L 27/10832; H01L 27/10858
USPC .................................................. 257/906, 908
See application file for complete search history.

(56) References Cited

U.S. PATENT DOCUMENTS

| | | | |
|---|---|---|---|
| 9,698,272 B1 | 7/2017 | Ikeda et al. | |
| 2016/0056249 A1 | 2/2016 | Kleemeier et al. | |
| 2019/0198503 A1 | 6/2019 | Zang et al. | |
| 2021/0066306 A1* | 3/2021 | Tang | H01L 29/66666 |

* cited by examiner

*Primary Examiner* — Hoai V Pham
(74) *Attorney, Agent, or Firm* — CKC & Partners Co., LLC

(57) ABSTRACT

A semiconductor structure includes a substrate, a drain region, a word line, a gate structure, and a first bit line. The drain region is disposed on the substrate. The gate structure is disposed on the drain region and has a portion in the word line. The first bit line is disposed on the gate structure to serve as a source region.

14 Claims, 10 Drawing Sheets

SEMICONDUCTOR STRUCTURE HAVING A GATE STRUCTURE PORTION IN A WORD LINE

BACKGROUND

Technical Field

The present disclosure relates to a semiconductor structure and a method of forming the semiconductor structure.

Description of Related Art

With the rapid growth of electronic industry, the development of semiconductor devices has achieved high performance and miniaturization. Generally, a transistor of a semiconductor structure may use an oxide semiconductor layer as a channel because of its off-state leakage current characteristics. However, a high-resistance metal-oxide layer is formed between the oxide semiconductor layer and a metal structure, which may cause an increase in the contact resistance. Thus, the performance of the semiconductor structure may be affected.

SUMMARY

According to one embodiment of the present disclosure, a semiconductor structure includes a substrate, a drain region, a word line, a gate structure, and a first bit line. The drain region is disposed on the substrate. The gate structure is disposed on the drain region and has a portion in the word line. The first bit line is disposed on the gate structure to serve as a source region.

In some embodiments of the present disclosure, the semiconductor structure further includes a capacitor disposed on the substrate. The drain region is embedded in the capacitor.

In some embodiments of the present disclosure, the semiconductor structure further includes a metal layer disposed between the capacitor and the substrate.

In some embodiments of the present disclosure, a top surface of the capacitor is at same horizontal level as a top surface of the drain region.

In some embodiments of the present disclosure, the capacitor includes a semiconductor material and a nitride-oxide-nitride structure surrounding the semiconductor material.

In some embodiments of the present disclosure, the semiconductor structure further includes a first metal structure disposed on the word line.

In some embodiments of the present disclosure, the semiconductor structure further includes a second bit line and a second metal structure. The first metal structure is between the second bit line and the first bit line. The second metal structure is disposed on the second bit line.

In some embodiments of the present disclosure, the first metal structure and the second metal structure are made of same materials.

In some embodiments of the present disclosure, the semiconductor structure further includes a first metal contact and a second metal contact. The first metal contact is disposed on the substrate. The second metal contact is disposed on the first metal contact.

In some embodiments of the present disclosure, a top surface of the first metal contact is at same horizontal level as a top surface of the drain region.

In some embodiments of the present disclosure, a top surface of the second metal contact is at same horizontal level as top surfaces of a first metal structure and a second metal structure on the word line.

In some embodiments of the present disclosure, the first metal contact and the second metal contact are made of different materials.

In some embodiments of the present disclosure, the semiconductor structure further includes a first dielectric structure and a second dielectric structure. The first dielectric structure is disposed on the substrate and surrounds the drain region. The second dielectric structure is disposed on the first dielectric structure and surrounds the first bit line.

In some embodiments of the present disclosure, lengthwise directions of the source region and the drain region are perpendicular to a lengthwise direction of the gate structure.

According to one embodiment of the present disclosure, a method of forming a semiconductor structure includes the following steps. A capacitor is formed on a substrate. A recess is formed in the capacitor. A drain region is formed in the recess. A word line is formed on the drain region. A gate structure is formed on the drain region, and the gate structure is electrically connected to the word line. A first bit line is formed on the gate structure, such that the first bit line servers as a source region.

In some embodiments of the present disclosure, the method further includes the following steps. A second bit line is formed when forming the first bit line. A first metal structure and a second metal structure are formed respectively on the word line and the second bit line.

In some embodiments of the present disclosure, the method further includes forming a first metal contact on the substrate before forming the word line.

In some embodiments of the present disclosure, forming the first metal contact is such that a top surface of the first metal contact is at same horizontal level as a top surface of the drain region.

In some embodiments of the present disclosure, forming a second metal contact on the first metal contact after forming the first and second bit lines.

In some embodiments of the present disclosure, forming the second metal contact and forming the first metal structure and the second metal structure are performed by using one deposition process.

In the aforementioned embodiments, since the gate structure is disposed on the drain region and has the portion in the word line and the first bit line is disposed on the gate structure to serve as the source region, low-resistance of the semiconductor structure can be achieved. As a result, the performance of the semiconductor structure can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
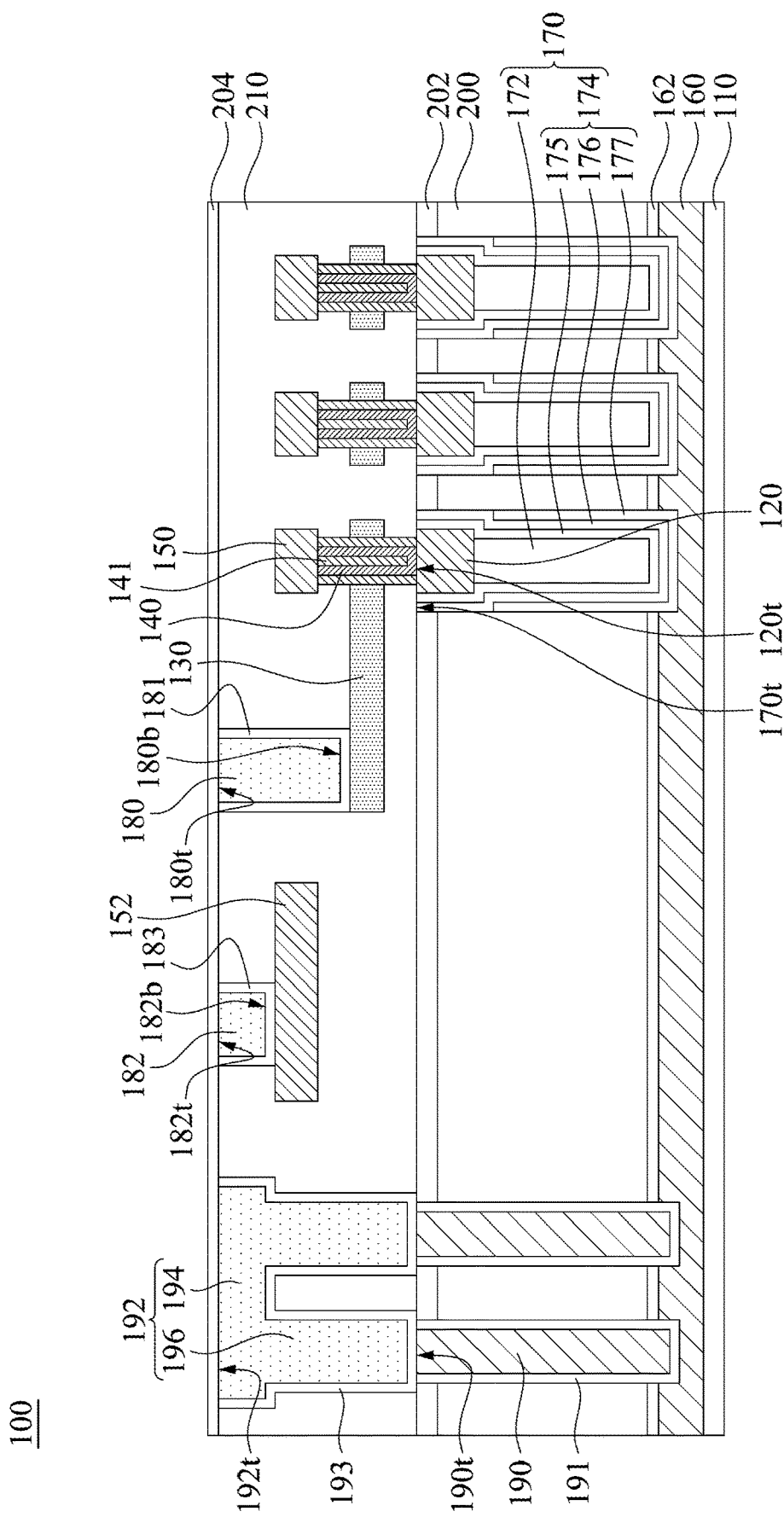
FIG. 1 is a cross-sectional view of a semiconductor structure in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

FIG. 1 is a cross-sectional view of a semiconductor structure 100 in accordance with one embodiment of the present disclosure. Referring to FIG. 1, a semiconductor structure 100 includes a substrate 110, a drain region 120, a word line 130, a gate structure 140, and a first bit line 150. The drain region 120 is disposed on the substrate 110. The gate structure 140 is disposed on the drain region 120 and has a portion in the word line 130. The first bit line 150 is disposed on the gate structure 140 to serve as a source region.

In greater detail, the semiconductor structure 100 includes a gate dielectric layer 141 disposed on the drain region 120. The gate dielectric layer 141 surrounds the gate structure 140. The gate structure 140 is in contact with the drain region 120. The word line 130 has a portion between the drain region 120 and the first bit line 150.

In the present embodiments, the drain region 120, the gate structure 140, and the first bit line (source region) 150 may serve as a vertical transistor. In greater details, a lengthwise direction of the first bit line (source region) 150 and a lengthwise direction of the drain region 120 are perpendicular to a lengthwise direction of the gate structure 140. In other words, the lengthwise direction of the gate structure 140 is perpendicular to a lengthwise direction of the substrate 110.

In some embodiments, the semiconductor structure 100 further includes a metal layer 160, a first isolation layer 162, and a capacitor 170 disposed on the substrate 110. The metal layer 160 is disposed between the capacitor 170 and the substrate 110. The first isolation layer 162 is in contact with the metal layer 160 and the capacitor 170. The drain region 120 is embedded in the capacitor 170. In greater details, the capacitor 170 includes a semiconductor material 172 and a nitride-oxide-nitride structure 174 surrounding the semiconductor material 172. The drain region 120 is aligned with the semiconductor material 172 of the capacitor 170. In some embodiments, a top surface 170$t$ of the capacitor 170 is at same horizontal level as a top surface 120$t$ of the drain region 120.

In some embodiments, the metal layer 160 may be made of tungsten (W). In some embodiments, the semiconductor material 172 may include silicon. The nitride-oxide-nitride structure 174 may include a titanium nitride layer 175, zirconium oxide layer 176, and titanium nitride layer 177.

In some embodiments, the semiconductor structure 100 further includes a first metal structure 180, a second bit line 152, and a second metal structure 182. The first metal structure 180 disposed on the word line 130. The first metal structure 180 is disposed between the first bit line 150 and the second bit line 152. The second metal structure 182 is disposed on the second bit line 152. In greater details, an adhesion layer 181 is disposed between the first metal structure 180 and the word line 130, and another adhesion layer 183 is disposed between the second metal structure 182 and the second bit line 152. In other words, the adhesion layers 181 and 183 are in contact with the word line 130 and the second bit line 152, respectively. The adhesion layers 181 and 183 can adhere the first metal structure 180 and the second metal structure 182, respectively.

In some embodiments, a top surface 180$t$ of the first metal structure 180 is at same horizontal level as a top surface 182$t$ of the second metal structure 182. In some embodiments, a bottom surface 180$b$ of the first metal structure 180 is below a bottom surface 182$b$ of the second metal structure 182.

In some embodiments, the first metal structure 180 and the second metal structure 182 may be made of same materials. For example, the first metal structure 180 and the second metal structure 182 may be made of copper (Cu).

In some embodiments, the semiconductor structure 100 further includes a first metal contact 190 and the second metal contact 192. The first metal contact 190 is disposed on the substrate 110, and the second metal contact 192 is disposed on the first metal contact 190. In greater details, an adhesion layer 191 is disposed between the first metal contact 190 and the metal layer 160, and another adhesion layer 193 is disposed between the second metal contact 192 and the first metal contact 190. In other words, the adhesion layers 191 and 193 are in contact with the metal layer 160 and the first metal contact 190, respectively. The adhesion layers 191 and 193 can adhere the first metal contact 190 and the second metal contact 192, respectively.

In some embodiments, the second metal contact 192 has a top portion 194 and the bottom portion 196 connected to the top portion 194. A width of the top portion 194 is larger than a width of the bottom portion 196. In some embodiments, the width of the bottom portion 196 of the second metal contact 192 is larger than a width of the first metal contact 190.

In some embodiments, a top surface 190$t$ of the first metal contact 190 is at same horizontal level as the top surface 120$t$ of the drain region 120. In greater details, the top surface 190$t$ of the first metal contact 190, the top surface 120$t$ of the drain region 120, and the top surface 170$t$ of the capacitor 170 are at same horizontal level.

In some embodiments, a top surface 192$t$ of the second metal contact 192 is at same horizontal level as the top surface 180$t$ of the first metal structure 180. In greater details, the top surface 192$t$ of the second metal contact 192, the top surface 180$t$ of the first metal structure 180, and the top surface 182$t$ of the second metal structure 182 are at same horizontal level.

In some embodiments, the first metal contact 190 and the second metal contact 192 may be made of different materials. For example, the first metal contact 190 may be made of tungsten (W), while the second metal contact 192 may be made of copper (Cu). Since the first metal contact 190 and the second metal contact 192 are made of different materials, the resistance of the semiconductor structure 100 can be decreased.

In some embodiments, the semiconductor structure 100 further includes a first dielectric structure 200 and a second dielectric structure 210. The first dielectric structure 200 is disposed on the substrate 110 and surrounds the drain region 120. The second dielectric structure 210 is disposed on the first dielectric structure 200 and surrounds the first bit line 150. In greater details, the first dielectric structure 200 further surrounds the capacitor 170 and the first metal contact 190. The second dielectric structure 210 further surrounds the word line 130, the gate structure 140, the second bit line 152, the first metal structure 180, the second metal structure 182, and the second metal contact 192.

In some embodiments, the first dielectric structure 200 and the second dielectric structure 210 may be made of same materials. For example, the first dielectric structure 200 and the second dielectric structure 210 may be made of oxide.

In some embodiments, the semiconductor structure 100 further includes a second isolation layer 202 and a third isolation layer 204 disposed on the first isolation layer 162. The first dielectric structure 200 and the second dielectric structure 210 are separated apart by the second isolation layer 202. The third isolation layer 204 is disposed on the first metal structure 180, the second metal structure 182, and the second metal contact 192. In some embodiments, the third isolation layer 204 is in contact with the first metal structure 180, the second metal structure 182, and the second metal contact 192.

In some embodiments, the first isolation layer 162, the second isolation layer 202, and the third isolation layer 204 may be made of same material. For example, the first isolation layer 162, the second isolation layer 202, and the third isolation layer 204 may be made of silicon oxide, silicon nitride or silicon oxynitride, or other suitable materials.

FIG. 2 to FIG. 10 are cross-sectional views of a method of forming a semiconductor structure at various stages in accordance with one embodiment of the present disclosure.

Figure 2:
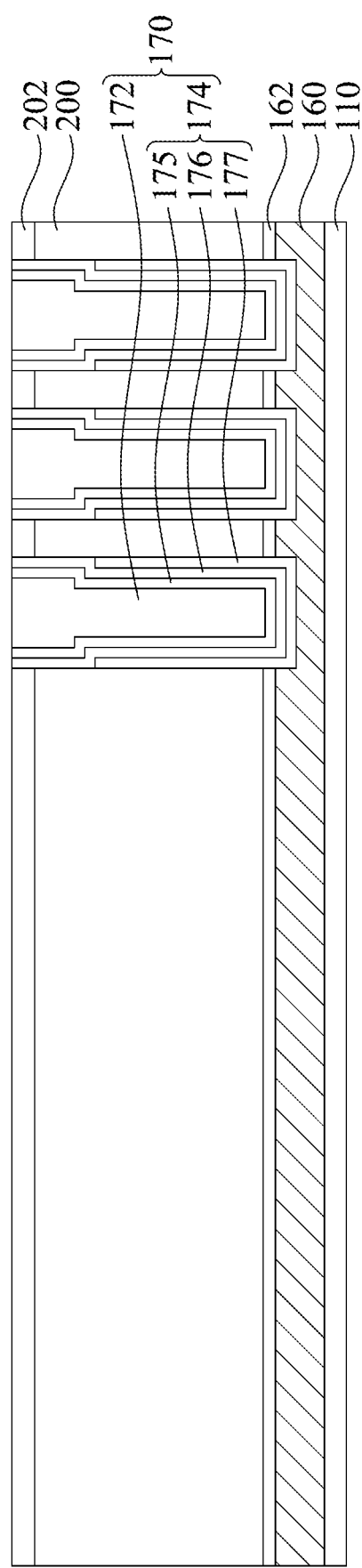
FIG. 2 to FIG. 10 are cross-sectional views of a method of forming a semiconductor structure at various stages in accordance with one embodiment of the present disclosure.

Referring to FIG. 2, the capacitor 170 is formed on the substrate 110. In greater details, the metal layer 160, the first isolation layer 162, the first dielectric structure 200, and the second isolation layer 202 are formed in sequence on the substrate 110. Then, an etching process may be performed to form an opening in the metal layer 160, the first isolation layer 162, the first dielectric structure 200, and the second isolation layer 202, and the semiconductor material 172 and the nitride-oxide-nitride structure 174 may be filled in the opening to form the capacitor 170. In some embodiments, a top surface of the semiconductor material 172 is at same horizontal level of a top surface of the nitride-oxide-nitride structure 174.

In some embodiments, the first dielectric structure 200 may be made of oxide or other suitable dielectric materials. In some embodiments, the first dielectric structure 200 may be formed by chemical vapor deposition (CVD), ALD, or other suitable process.

In some embodiments, the first isolation layer 162 and the second isolation layer 202 may be made of same material. For example, the first isolation layer 162 and the second isolation layer 202 may be made of silicon nitride. In some embodiments, the first isolation layer 162 and the second isolation layer 202 may be formed by chemical vapor deposition (CVD), ALD, or other suitable process.

Figure 3:
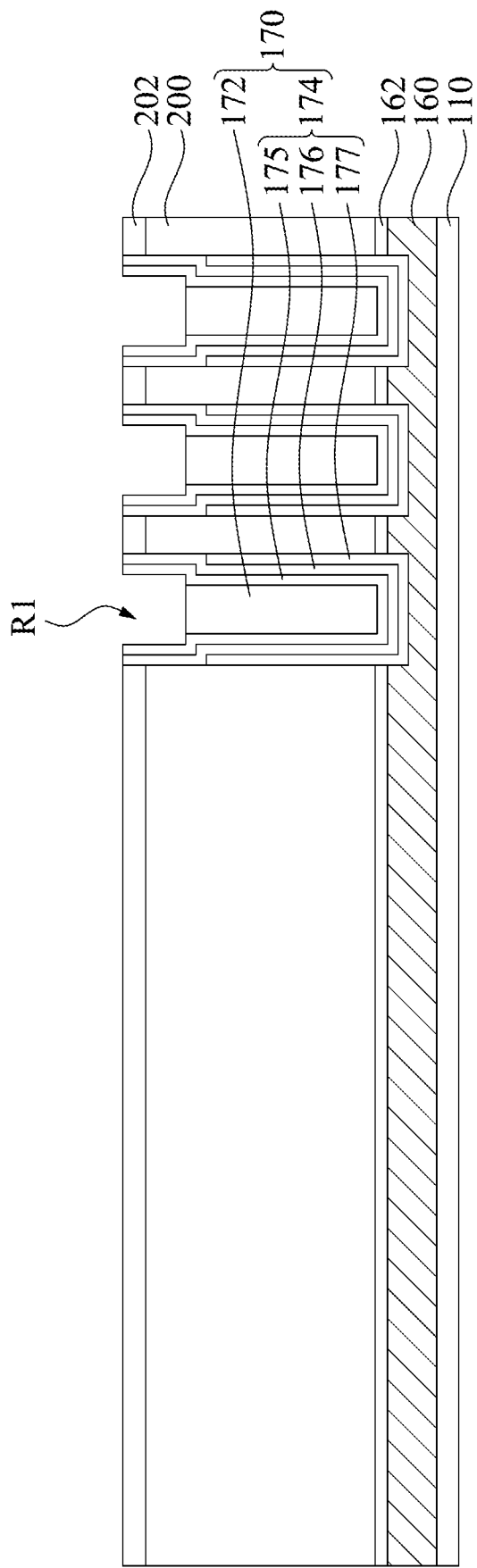

Referring to FIG. 3, after the capacitor 170 is formed on the substrate 110, a recess R1 is formed in the capacitor 170. In greater details, the semiconductor material 172 is etched to form the recess R1, such that the top surface of the semiconductor material 172 is below the top surface of the nitride-oxide-nitride structure 174.

Figure 4:
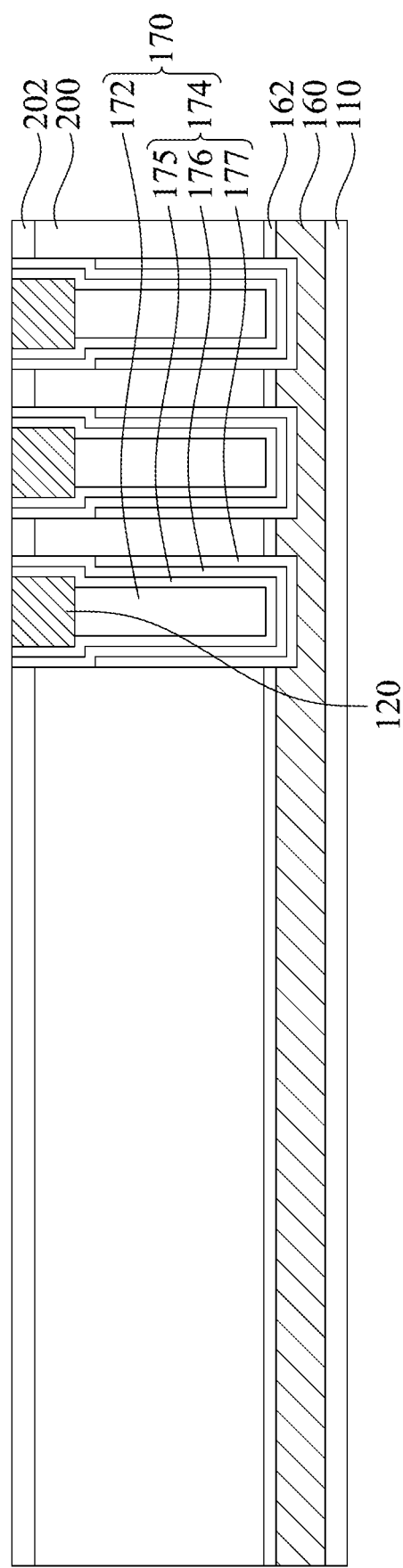

Referring to FIG. 3 and FIG. 4, after the recess R1 is formed in the capacitor 170, the drain region 120 is formed in the recess R1. Since the recess R1 is formed by etching semiconductor material 172 of the capacitor 170, the drain region 120 is formed in self-aligned in the recess R1. The drain region 120 is embedded in the capacitor 170. In some embodiments, the drain region 120 may made of an indium tin oxide (ITO), or other suitable conductive materials.

Figure 5:
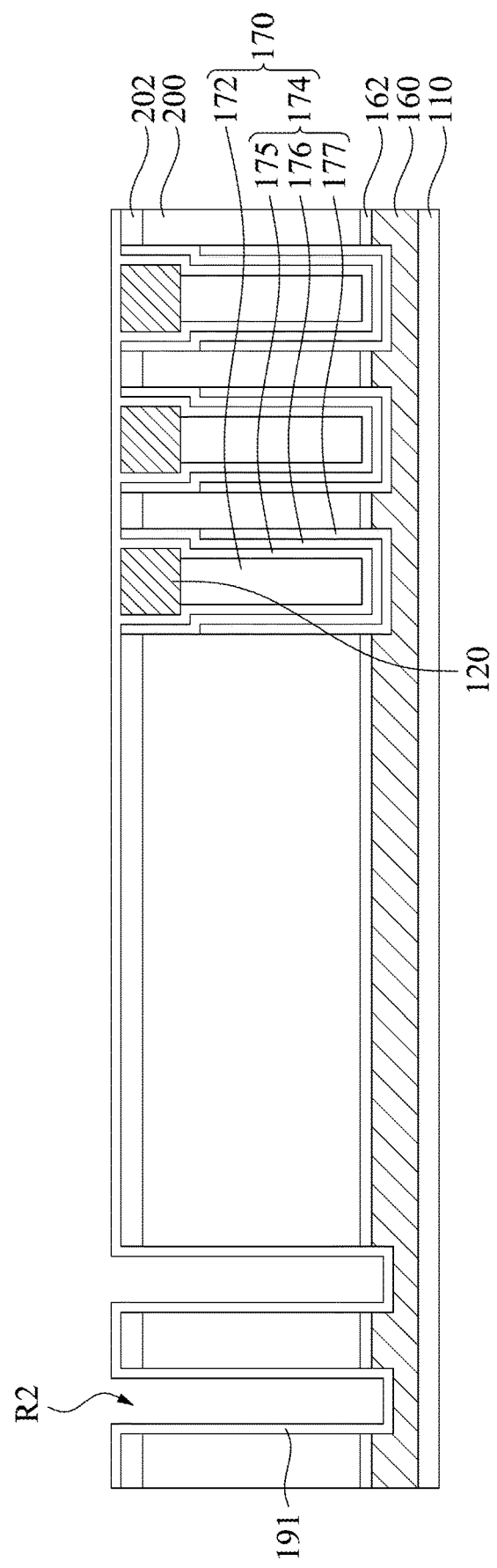

Referring to FIG. 5, after the drain region 120 is formed, a recess R2 is formed in the metal layer 160, the first isolation layer 162, the first dielectric structure 200, and the second isolation layer 202. In greater details, the metal layer 160, the first isolation layer 162, the first dielectric structure 200, and the second isolation layer 202 are etched, such that the metal layer 160 is exposed.

After the recess R2 is formed, the adhesive layer 191 is formed on a sidewall and a bottom surface of the recess R2. The adhesive layer 191 further covers the second isolation layer 202 and the drain region 120. In some embodiments, a bottom surface of the adhesive layer 191 is at same horizontal level as a bottom surface of the capacitor 170. In some embodiments, the adhesive layer 191 may made of titanium nitride.

Figure 6:
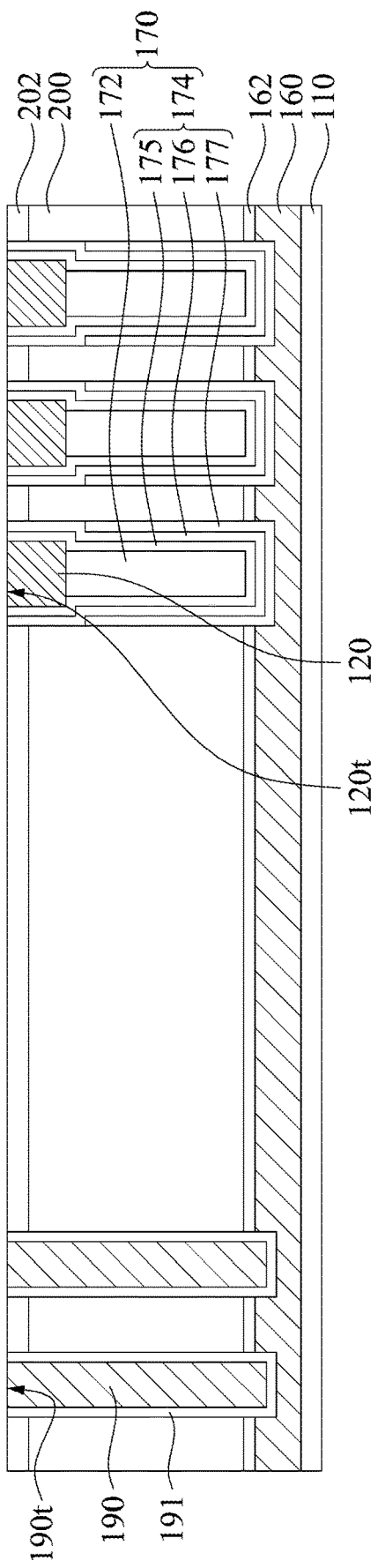

Referring to FIG. 5 and FIG. 6, after the adhesive layer 191 is formed, the first metal contact 190 is formed on the adhesive layer 191. After the first metal contact 190 is formed, a planarization operation is performed, such as a chemical mechanical polishing (CMP) operation, to remove a portion of the adhesive layer 191. As a result, the top surface 190*t* of the first metal contact 190 is at same horizontal level as the top surface 120*t* of the drain region 120.

In some embodiments, the adhesion layer 191 is in contact with the metal layer 160 and the first metal contact 190. The adhesion layer 191 can adhere the first metal contact 190. In greater details, the adhesion layer 191 enables the first metal contact 190 to have improved filling characteristics in the recess R2, and therefore results in forming the first metal contact 190 without leaving unfilled voids therein.

Figure 7:
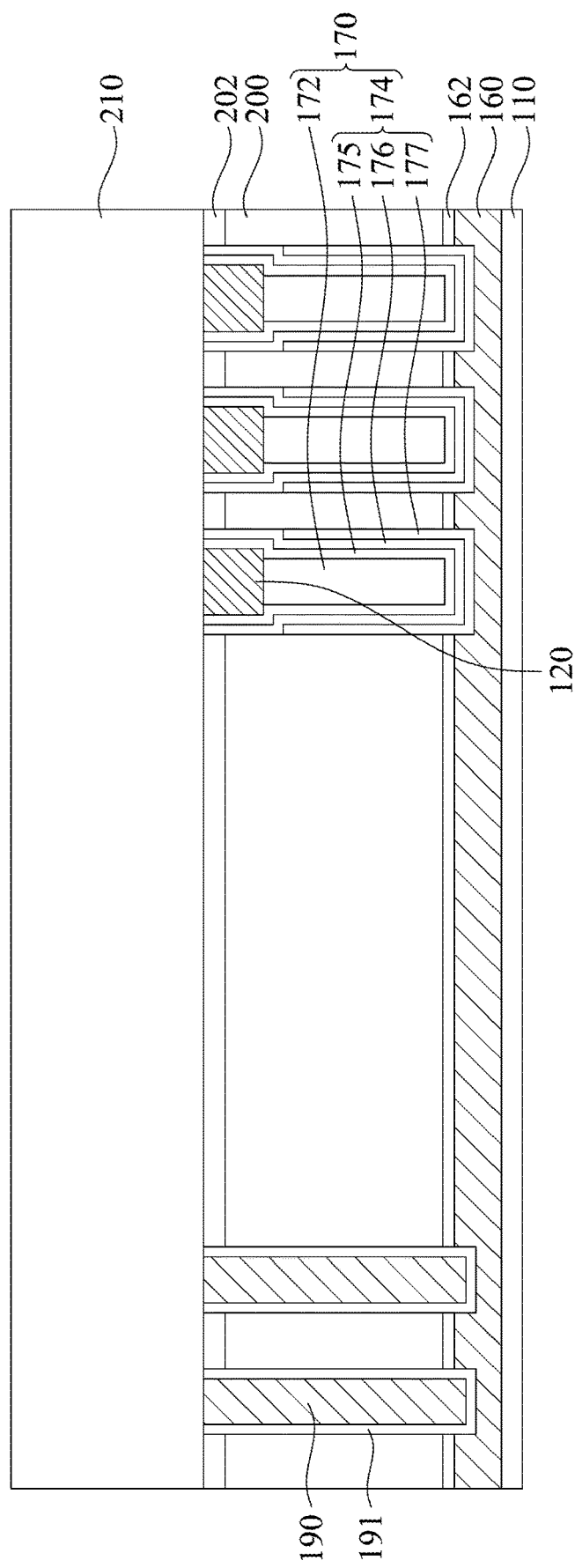

Referring to FIG. 7, after the first metal contact 190 is formed, the second dielectric structure 210 is formed on the drain region 120 and the first metal contact 190. In other words, the second dielectric structure 210 covers the drain region 120, the first metal contact 190, and the second isolation layer 202. In some embodiments, the second dielectric structure 210 is made of oxide or other suitable dielectric materials. In some embodiments, the second dielectric structure 210 is formed by chemical vapor deposition (CVD), ALD, or other suitable process.

Figure 8:
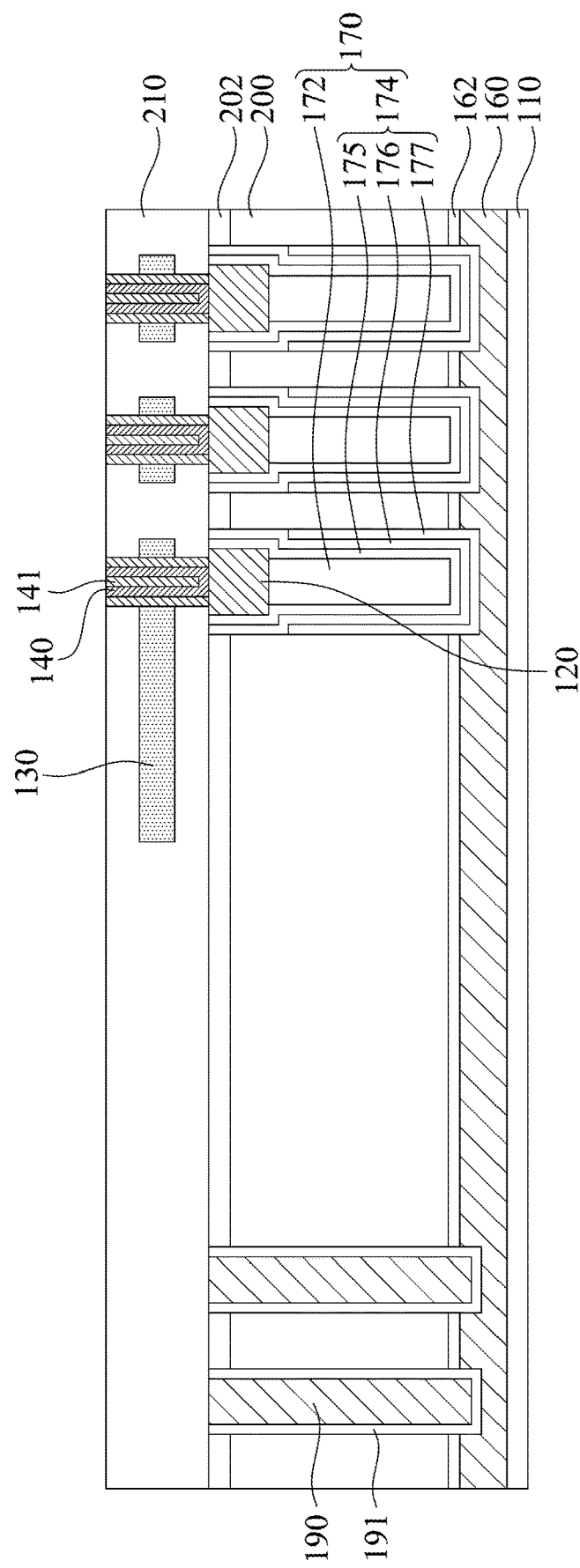

Referring to FIG. 8, after the second dielectric structure 210 is formed, the word line 130 is formed on the drain region 120. After the word line 130 is formed, the gate structure 140 is formed on the drain region 120. The gate structure 140 is electrically connected to the word line 130.

In some embodiments, after the word line 130 and the gate structure 140 formed, a planarization operation is performed, such as a chemical mechanical polishing (CMP) operation, to remove a portion of the second dielectric structure 210. As a result, the gate structure 140 and the gate dielectric layer 141 are exposed.

In some embodiments, the gate structure 140 may be made of indium gallium zinc oxide (IGZO), or other suitable conductive metals. For example, the gate structure 140 is an IGZO film which is beneficial to decrease the rate of leakage. In some embodiments, the gate dielectric layer 141 may be made of silicon oxide, or other suitable dielectric materials.

Figure 9:
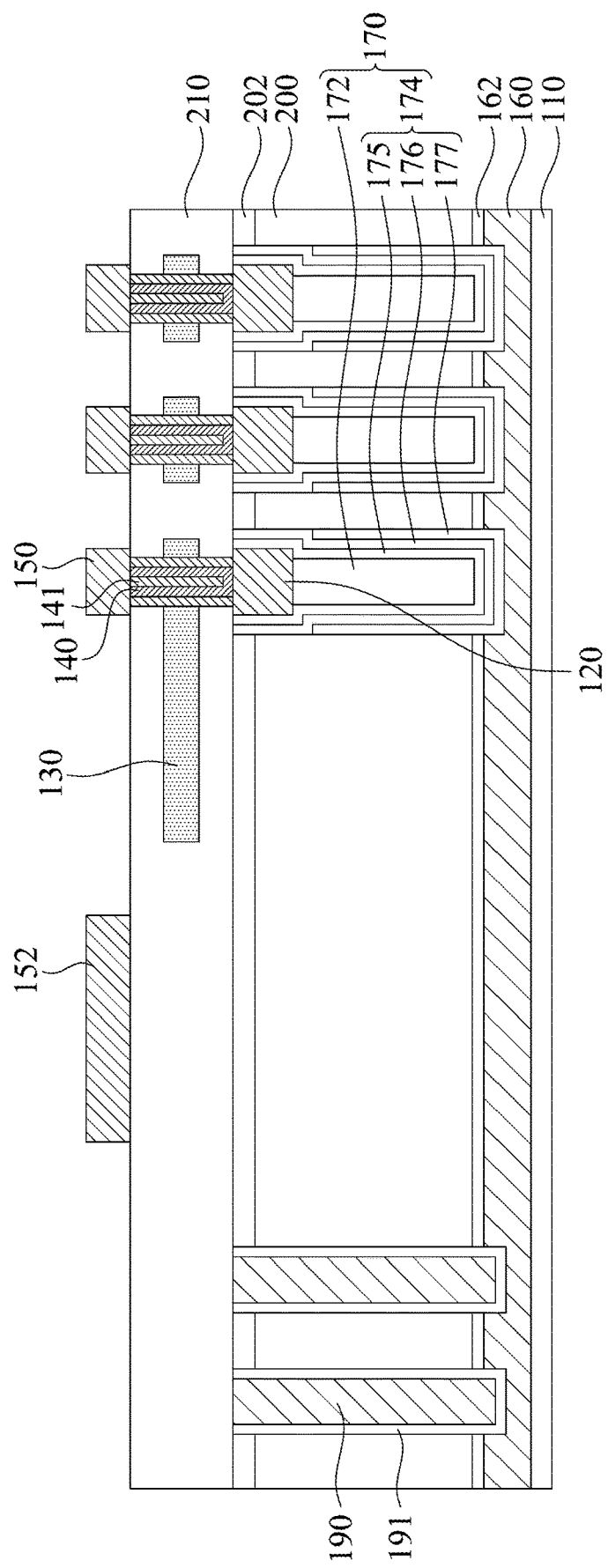

Referring to FIG. 9, after the gate structure 140 is formed on the drain region 120, the first bit line 150 is formed on the gate structure 140, such that the first bit line 150 serve as the source drain. In greater details, the second bit line 152 is formed when the first bit line 150 is formed. The method of forming the first bit line 150 and the second bit line 152 may include forming a conductive material layer and then patterning the conductive material layer with a photolithography process.

In some embodiments, the first bit line 150 and the second bit line 152 may made of an indium tin oxide (ITO), or other suitable conductive materials. In some embodiments, the drain region 120, the first bit line 150, and the second bit line 152 may made of same materials.

Figure 10:
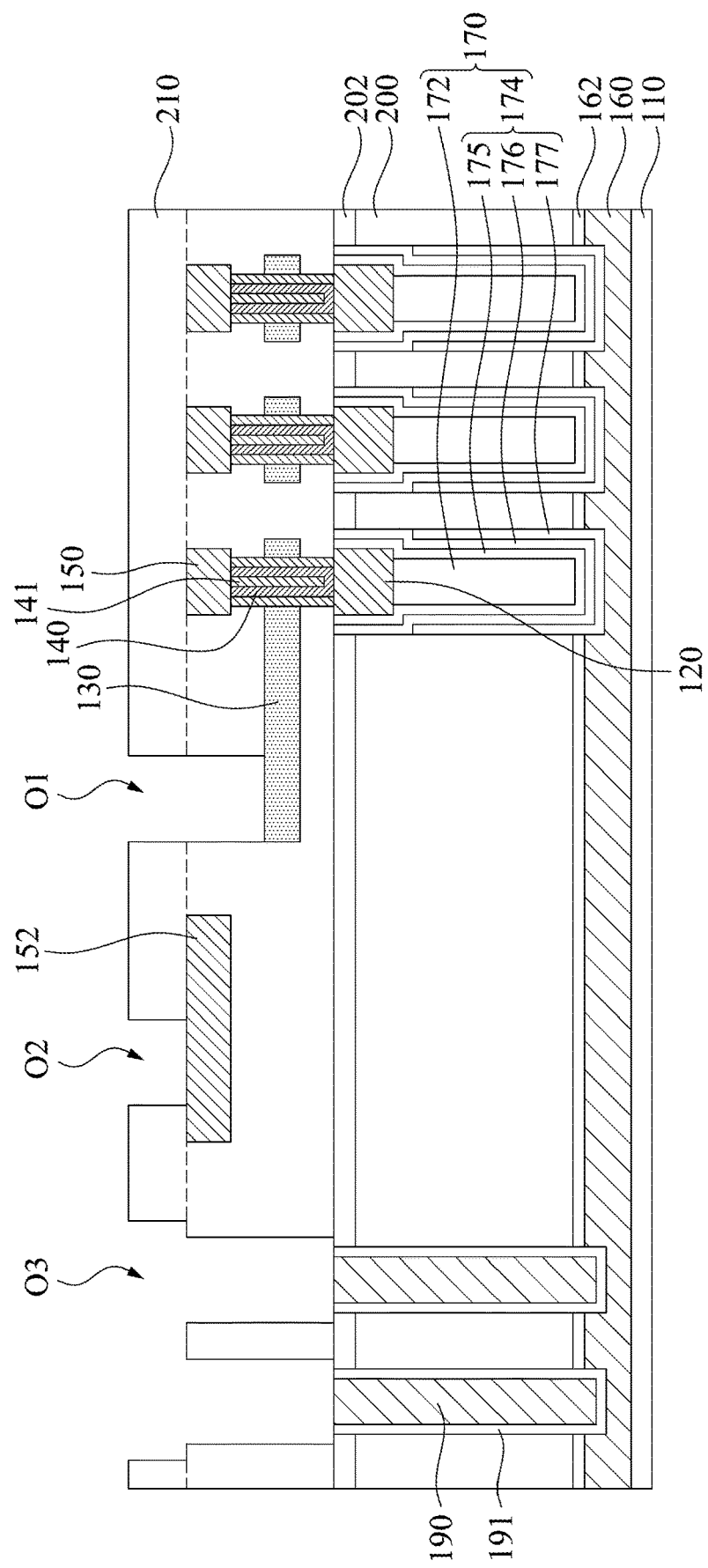

Referring to FIG. 9 and FIG. 10, after the first bit line 150 and the second bit line 152 are formed, another second dielectric structure 210 is formed on the second dielectric structure 210 of FIG. 9. The second dielectric structure 210 of FIG. 10 and the second dielectric structure 210 of FIG. 9 may be the same. In other words, the second dielectric structure 210 of FIG. 10 and the second dielectric structure 210 of FIG. 9 may be made of same materials. For clarify, a dash line in FIG. 10 is to illustrate that there is no interface in the second dielectric structure 210.

As shown in FIG. 10, openings O1, O2, and O3 are formed in the second dielectric structure 210. In greater details, the opening O1 expose the word line 130, the opening O2 expose the second bit line 152, and the opening O3 exposes the first metal contact 190.

After the O1, O2, and O3 are formed in the second dielectric structure 210, the first metal structure 180, the second metal structure 182 and the second metal contact 192 are formed in openings O1, O2, and O3, respectively. In greater details, the adhesive layer 181 is formed on a sidewall and a bottom surface of the opening O1, and then the first metal structure 180 is formed on the adhesive layer 181. The adhesive layer 183 is formed on a sidewall and a bottom surface of the opening O2, and then the second metal structure 182 is formed on the adhesive layer 183. The adhesive layer 193 is formed on a sidewall and a bottom surface of the opening O3, and then the second metal contact 192 is formed on the adhesive layer 193. As a result, the semiconductor structure 100 as shown in FIG. 1 can be obtained.

In some embodiments, forming the second metal contact 192 and forming the first metal structure 180 and the second metal structure 182 are performed by using one deposition process. In some embodiments, forming first metal contact 190 and forming the second metal contact 192 are performed by using different deposition processes, thermal budget can be reduced after the gate structure 140 is formed.

In some embodiments, the adhesive layers 181, 183, and 193 may made of same materials, such as tantalum (Ta). In some embodiments, the first metal structure 180, the second metal structure 182, and the second metal contact 192 may made of same materials, such as copper (Cu).

In summary, the semiconductor structure includes the substrate, the drain region, the word line, the gate structure, and the first bit line. The gate structure is disposed on the drain region and has the portion in the word line, and the first bit line is disposed on the gate structure to serve as the source region. By using the semiconductor structure, low-resistance of the semiconductor structure can be achieved, and the performance of the semiconductor structure can be improved.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A semiconductor structure, comprising:
    a substrate;
    a drain region disposed on the substrate;
    a word line disposed on the drain region;
    a gate structure disposed on the drain region and has a portion in the word line; and
    a first bit line disposed on the gate structure to serve as a source region.

2. The semiconductor structure of claim 1, further comprising:
    a capacitor disposed on the substrate, wherein the drain region is embedded in the capacitor.

3. The semiconductor structure of claim 2, further comprising:
    a metal layer disposed between the capacitor and the substrate.

4. The semiconductor structure of claim 2, wherein a top surface of the capacitor is at same horizontal level as a top surface of the drain region.

5. The semiconductor structure of claim 2, wherein the capacitor comprises a semiconductor material and a nitride-oxide-nitride structure surrounding the semiconductor material.

6. The semiconductor structure of claim 1, further comprising:
    a first metal structure disposed on the word line.

7. The semiconductor structure of claim 6, further comprising:
    a second bit line, wherein the first metal structure is between the second bit line and the first bit line; and
    a second metal structure disposed on the second bit line.

8. The semiconductor structure of claim 7, wherein the first metal structure and the second metal structure are made of same materials.

9. The semiconductor structure of claim 7, further comprising:
    a first metal contact disposed on the substrate; and
    a second metal contact disposed on the first metal contact.

10. The semiconductor structure of claim 9, wherein a top surface of the first metal contact is at same horizontal level as a top surface of the drain region.

11. The semiconductor structure of claim 9, wherein a top surface of the second metal contact is at same horizontal level as top surfaces of a first metal structure and a second metal structure on the word line.

12. The semiconductor structure of claim 9, wherein the first metal contact and the second metal contact are made of different materials.

13. The semiconductor structure of claim 1, further comprising:
    a first dielectric structure disposed on the substrate and surrounding the drain region; and
    a second dielectric structure disposed on the first dielectric structure and surrounding the first bit line.

14. The semiconductor structure of claim 1, wherein lengthwise directions of the source region and the drain region are perpendicular to a lengthwise direction of the gate structure.

* * * * *